(12) United States Patent
Tanaka

(10) Patent No.: US 7,583,161 B2
(45) Date of Patent: Sep. 1, 2009

(54) SURFACE ACOUSTIC WAVE DEVICE AND BOUNDARY ACOUSTIC WAVE DEVICE

(75) Inventor: Nobuhira Tanaka, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/172,350

(22) Filed: Jul. 14, 2008

(65) Prior Publication Data

US 2008/0266023 A1    Oct. 30, 2008

Related U.S. Application Data

(63) Continuation of application No. PCT/JP2006/322383, filed on Nov. 9, 2006.

(30) Foreign Application Priority Data

Jan. 18, 2006    (JP)    ............... 2006-010482

(51) Int. Cl.
*H03H 9/00* (2006.01)
*H03H 9/10* (2006.01)

(52) U.S. Cl. .................... 333/133; 333/193
(58) Field of Classification Search ................ 333/133, 333/193, 194, 195, 196
See application file for complete search history.

(56) References Cited

U.S. PATENT DOCUMENTS

| | | | |
|---|---|---|---|
| 6,710,682 B2 * | 3/2004 | Onishi et al. ............ | 333/193 |
| 6,737,936 B2 | 5/2004 | Noguchi | |
| 7,385,463 B2 * | 6/2008 | Koga et al. ............. | 333/133 |
| 2004/0145278 A1 | 7/2004 | Iwamoto | |
| 2004/0155730 A1 | 8/2004 | Iwamoto et al. | |
| 2005/0151602 A1 | 7/2005 | Hattanda et al. | |
| 2006/0138902 A1 | 6/2006 | Kando | |
| 2006/0192462 A1 | 8/2006 | Iwamoto et al. | |

FOREIGN PATENT DOCUMENTS

JP    07-016427 U    3/1995

(Continued)

OTHER PUBLICATIONS

IEEE, The Authoritative Dictionary of IEEE Standards Terms, IEEE Press, Seventh Edition, 1 page (1253).*

(Continued)

*Primary Examiner*—Dean O Takaoka
(74) *Attorney, Agent, or Firm*—Keating & Bennett, LLP

(57) ABSTRACT

A piezoelectric substrate is joined to a cover with a support layer disposed therebetween and with a space maintained therebetween. A transmission surface acoustic wave filter and a reception surface acoustic wave filter are disposed on a major surface of the piezoelectric substrate adjacent to the cover and inside the support layer. External electrodes are provided on the side of the cover opposite to the side facing the piezoelectric substrate. The external electrodes include an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter. A portion of an interconnection line that electrically connects the reception surface acoustic wave filter to the antenna terminal is disposed on the cover.

14 Claims, 12 Drawing Sheets

| | FOREIGN PATENT DOCUMENTS | |
|---|---|---|
| JP | 10-256869 A | 9/1998 |
| JP | 2000-261282 A | 9/2000 |
| JP | 2000-261284 A | 9/2000 |
| JP | 2003-037471 A | 2/2003 |
| JP | 2003-051731 A | 2/2003 |
| JP | 2005-079694 A | 3/2005 |

OTHER PUBLICATIONS

Official Communication issued in International Patent Application No. PCT/JP2006/322383, mailed on Feb. 13, 2007.

* cited by examiner

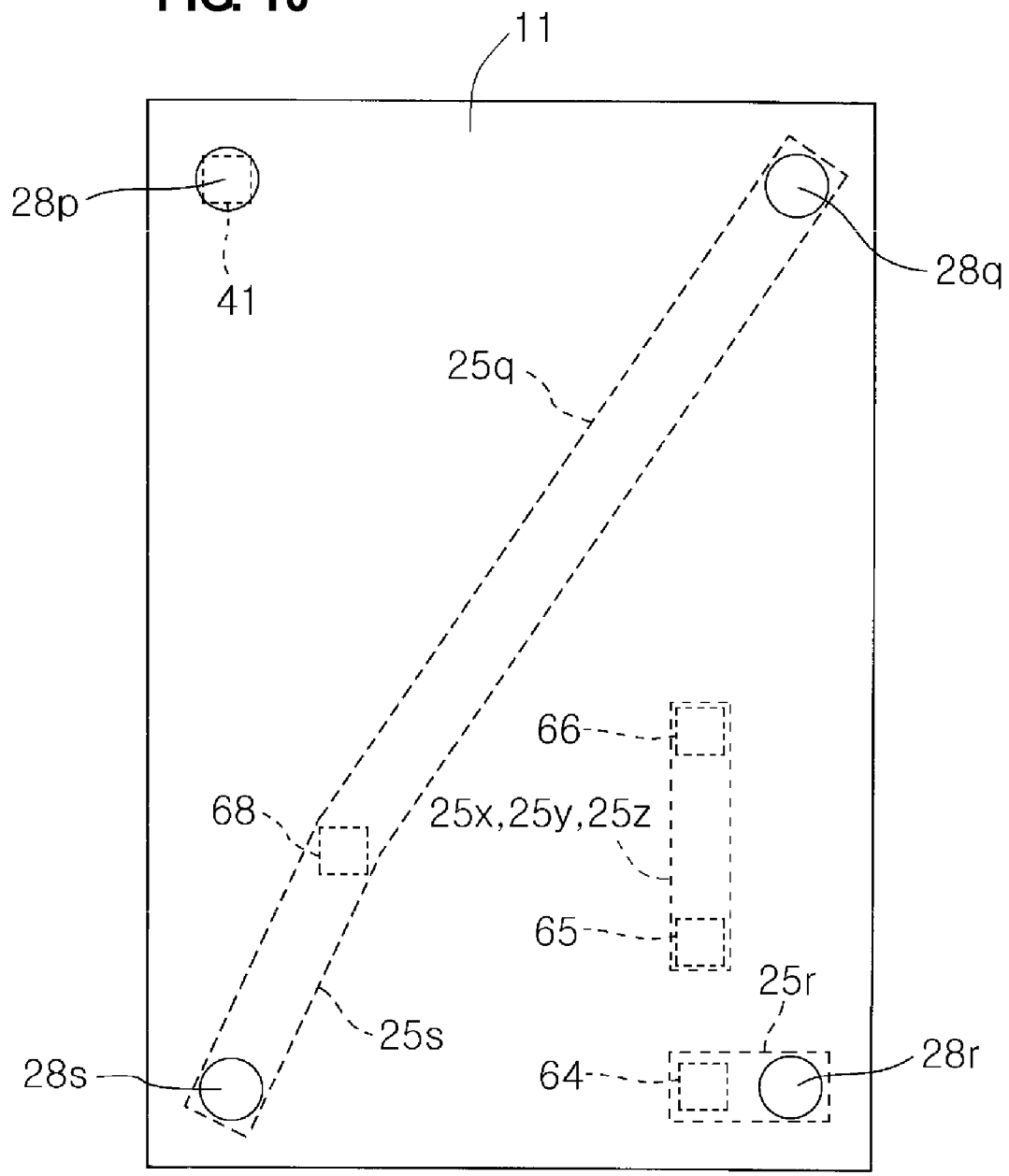

SURFACE ACOUSTIC WAVE DEVICE AND BOUNDARY ACOUSTIC WAVE DEVICE

BACKGROUND OF THE INVENTION

1. Field of the Invention

The present invention relates to a surface acoustic wave device and a boundary acoustic wave device.

2. Description of the Related Art

In recent years, a wafer-level chip-size packaging (WLCSP) technology has been developed that reduces the size of a package of a surface acoustic wave device, such as a surface acoustic wave filter, and a boundary acoustic wave device, such as a boundary acoustic wave filter, to a component chip size.

For example, as shown in FIG. 13, a surface acoustic wave device includes a piezoelectric substrate 1 and a resin substrate 7 that faces the piezoelectric substrate 1. The piezoelectric substrate 1 includes a conductor pattern having an IDT (a comb-shaped electrode) 2, a reflector 3, and a pad 4 provided thereon. The resin substrate 7 includes an external electrode 8. The piezoelectric substrate 1 and the resin substrate 7 are bonded and sealed by light curable resins 6a and 6b. The pad 4 is electrically connected to the external electrode 8 (refer to, for example, Japanese Unexamined Patent Application Publication No. 2003-37471).

When such a structure in which a piezoelectric substrate is covered and sealed by a cover is applied to surface acoustic wave devices and boundary acoustic wave devices, capacitive coupling tends to increase. In particular, when the sizes of the devices are reduced by using a wafer-level chip-size packaging (WLCSP) structure, the capacitive coupling significantly increases. An increasing capacitive coupling deteriorates the isolation characteristics and VSWR.

SUMMARY OF THE INVENTION

To overcome the problems described above, preferred embodiments of the present invention provide a surface acoustic wave device and a boundary acoustic wave device that reduces capacitive coupling between signal lines.

A surface acoustic wave device according to a preferred embodiment of the present invention includes a piezoelectric substrate, a cover joined to the piezoelectric substrate with a support layer therebetween and with a spacing maintained therebetween, and a transmission surface acoustic wave filter and a reception surface acoustic wave filter provided on a major surface of the piezoelectric substrate adjacent to the cover and inside the support layer. External electrodes are provided on the side of the cover opposite to the side facing the piezoelectric substrate. The external electrodes include an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter. The reception surface acoustic wave filter is electrically connected to the antenna terminal via an interconnection line, and the interconnection line includes (a) a piezoelectric substrate line disposed on the piezoelectric substrate, (b) a cover line disposed on one of an upper surface and a lower surface of the cover, and (c) a via line that passes through the support layer and the cover so as to connect one end of the piezoelectric substrate line to one end of the cover line.

Such a structure reduces capacitive coupling between signal lines by reducing the length of the piezoelectric line or by separating the piezoelectric line disposed on the piezoelectric substrate of the interconnection line used for electrically connecting the reception surface acoustic wave filter to the antenna terminal using the cover line and the via line.

Preferably, the reception surface acoustic wave filter is a balanced surface acoustic wave filter including one unbalanced signal terminal to which an unbalanced signal is input and two balanced signal terminals that output balanced signals, and the antenna terminal is electrically connected to the unbalanced signal terminal. The reception output terminal is electrically connected to the balanced signal terminals.

Such a structure provides a balanced surface acoustic wave filter having, in particular, an excellent balanced characteristic.

Note that the reception output terminal may be a pair of external electrodes, each connected to a corresponding one of the two balanced signal terminals of the balanced filter.

A surface acoustic wave device according to another preferred embodiment of the present invention includes a piezoelectric substrate, a cover joined to the piezoelectric substrate with a support layer therebetween and with a spacing maintained therebetween, and a transmission surface acoustic wave filter and a reception surface acoustic wave filter disposed on a major surface of the piezoelectric substrate adjacent to the cover and inside the support layer. External electrodes are provided on the side of the cover opposite to the side facing the piezoelectric substrate. The external electrodes include an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter. The transmission surface acoustic wave filter includes a plurality of series-connected surface acoustic wave resonators. An interconnection line that electrically connects at least one pair of the neighboring series-connected surface acoustic wave resonators includes (a) at least one cover line disposed on one of an upper surface and a lower surface of the cover and (b) at least one pair of via lines that pass through at least the support layer so as to connect the at least one cover line to one of the at least one pair of the neighboring series-connected surface acoustic wave resonators and the other surface acoustic wave resonator.

Such a structure reduces capacitive coupling between signal lines by removing a line disposed on the piezoelectric substrate of the interconnection line used for electrically connecting the at least one pair of neighboring series-connected surface acoustic wave resonators of the transmission surface acoustic wave filter using the cover line and the via line, by reducing the length of the line disposed on the piezoelectric substrate, or by separating the line disposed on the piezoelectric substrate.

A surface acoustic wave device according to another preferred embodiment of the present invention includes a piezoelectric substrate, a cover joined to the piezoelectric substrate with a support layer therebetween and with a spacing kept therebetween, and a transmission surface acoustic wave filter and a reception surface acoustic wave filter provided on a major surface of the piezoelectric substrate adjacent to the cover and inside the support layer. External electrodes are provided on the side of the cover opposite to the side facing the piezoelectric substrate. The external electrodes include an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter. The reception surface acoustic wave filter includes a plurality of series-connected surface acoustic wave resonators. An interconnection line that electrically connects at least one pair of the neighboring series-connected surface acoustic wave resonators includes (a) at least one cover line disposed on one of an upper surface and a lower surface of the cover and (b) at least one pair of via lines that pass through at least the support layer so as to connect the at least one cover line to one of the at least one pair of the neighboring series-connected surface acoustic wave resonators and the other surface acoustic wave resonator.

Such a structure reduces capacitive coupling between signal lines by removing a line disposed on the piezoelectric substrate of the interconnection line used for electrically connecting the at least one pair of neighboring series-connected surface acoustic wave resonators of the reception surface acoustic wave filter, by reducing the length of the line disposed on the piezoelectric substrate, or by separating the line disposed on the piezoelectric substrate.

Note that at least one pair of neighboring series-connected surface acoustic wave resonators of the reception surface acoustic wave filter may be a longitudinally coupled resonator type surface acoustic wave filter including three IDTs and a surface acoustic wave resonator including one IDT.

A surface acoustic wave device according to another preferred embodiment of the present invention includes a piezoelectric substrate, a cover joined to the piezoelectric substrate with a support layer therebetween and with a spacing kept therebetween, a surface acoustic wave filter provided on a major surface of the piezoelectric substrate adjacent to the cover and inside the support layer, and external terminals provided on the side of the cover opposite that facing the piezoelectric substrate. The external terminals include an input terminal and an output terminal electrically connected to the surface acoustic wave filter. The surface acoustic wave filter includes a plurality of series-connected surface acoustic wave elements. An interconnection line that electrically connects at least one pair of the neighboring series-connected surface acoustic wave elements includes (a) at least one cover line disposed on one of an upper surface and a lower surface of the cover and (b) at least one pair of via lines that passes through at least the support layer so as to connect the at least one cover line to one of the at least one pair of the neighboring series-connected surface acoustic wave elements and the other surface acoustic wave element.

Such a structure reduces capacitive coupling between signal lines.

Preferably, in the above-described preferred embodiments, the cover is disposed inside a peripheral portion of the piezoelectric substrate when viewed in a direction substantially perpendicular to the major surface of the piezoelectric substrate, and the surface acoustic wave device further includes a reinforcing resin that covers substantially an entire portion from the major surface of the cover remote from the piezoelectric substrate to the peripheral portion of the major surface of the piezoelectric substrate.

Such a structure seals the reception surface acoustic wave filter and the transmission surface acoustic wave filter with the reinforcing resin. Accordingly, a sufficient resistance to moisture is obtained. Thus, for example, after the surface acoustic wave device is mounted on a circuit board, the surface acoustic wave device does not need to be covered with a resin.

Preferably, the cover line is formed by plating.

A boundary acoustic wave device according to another preferred embodiment of the present invention includes a piezoelectric substrate, a cover joined to the piezoelectric substrate with a support layer therebetween, a transmission boundary acoustic wave filter and a reception boundary acoustic wave filter provided at an interface between the piezoelectric substrate and the support layer, and external electrodes provided on the side of the cover opposite to the side facing the piezoelectric substrate. The external electrodes include an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter. The reception boundary acoustic wave filter is electrically connected to the antenna terminal using an interconnection line, and the interconnection line includes (a) a piezoelectric substrate line disposed on the piezoelectric substrate, (b) a support layer line disposed on an upper surface of the cover, and (c) a via line that passes through the support layer so as to connect one end of the piezoelectric substrate line to one end of the support layer line.

Such a structure reduces capacitive coupling between signal lines by reducing the length of the piezoelectric line or by separating the piezoelectric line disposed on the piezoelectric substrate of the interconnection line used for electrically connecting the reception boundary acoustic wave filter to the antenna terminal using the cover line and the via line.

Preferably, the reception boundary acoustic wave filter is a balanced boundary acoustic wave filter including one unbalanced signal terminal to which an unbalanced signal is input and two balanced signal terminals that output balanced signals, and the antenna terminal is electrically connected to the unbalanced signal terminal. The reception output terminal is electrically connected to the balanced signal terminals.

Such a structure provides a balanced boundary acoustic wave filter having, in particular, an excellent balanced characteristic.

Note that the reception output terminal may be a pair of external electrodes, each connected to a corresponding one of the two balanced signal terminals of the balanced filter.

A boundary acoustic wave device according to another preferred embodiment of the present invention includes a piezoelectric substrate, a cover joined to the piezoelectric substrate with a support layer therebetween, a transmission boundary acoustic wave filter and a reception boundary acoustic wave filter provided at an interface between the piezoelectric substrate and the support layer, and external electrodes provided on the side of the cover opposite to the side facing the piezoelectric substrate. The external electrodes include an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter. The transmission boundary acoustic wave filter includes a plurality of series-connected boundary acoustic wave resonators. An interconnection line that electrically connects at least one pair of the neighboring series-connected boundary acoustic wave resonators includes (a) at least one support layer line disposed on an upper surface of the support layer and (b) at least one pair of via lines that passes through at least the support layer so as to connect the at least one support layer line to one of the at least one pair of the neighboring series-connected boundary acoustic wave resonators and the other boundary acoustic wave resonator.

Such a structure reduces capacitive coupling between signal lines by removing a line disposed on the piezoelectric substrate of the interconnection line used for electrically connecting the at least one pair of neighboring series-connected boundary acoustic wave resonators of the transmission boundary acoustic wave filter using the cover line and the via line, by reducing the length of the line disposed on the piezoelectric substrate, or by separating the line disposed on the piezoelectric substrate.

A boundary acoustic wave device according to another preferred embodiment of the present invention includes a piezoelectric substrate, a cover joined to the piezoelectric substrate with a support layer therebetween, a transmission boundary acoustic wave filter and a reception boundary acoustic wave filter disposed at an interface between the piezoelectric substrate and the support layer, and external electrodes provided on the side of the cover opposite to the side facing the piezoelectric substrate. The external electrodes include an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter. The reception boundary acoustic wave filter includes a plurality of series-connected boundary acoustic wave resonators. An interconnection line that electrically connects at least one pair of the neighboring series-connected boundary acoustic wave resonators includes (a) at least one support layer line disposed on an upper surface of the cover and (b) at least one pair of via lines that passes through at least the support layer so as to connect the at least one support layer line to one of the at least one pair of the neighboring series-connected boundary acoustic wave resonators and the other boundary acoustic wave resonator.

Such a structure reduces capacitive coupling between signal lines by removing a line disposed on the piezoelectric substrate of the interconnection line used for electrically connecting the at least one pair of neighboring series-connected boundary acoustic wave resonators of the reception boundary acoustic wave filter, by reducing the length of the line disposed on the piezoelectric substrate, or by separating the line disposed on the piezoelectric substrate.

Note that at least one pair of neighboring series-connected boundary acoustic wave resonators of the reception boundary acoustic wave filter may be a longitudinally coupled resonator type boundary acoustic wave filter including three IDTs and a boundary acoustic wave resonator including one IDT.

A boundary acoustic wave device according to another preferred embodiment of the present invention includes a piezoelectric substrate, a cover joined to the piezoelectric substrate with a support layer therebetween, a boundary acoustic wave filter disposed at an interface between the piezoelectric substrate and the support layer, and external terminals provided on the side of the cover opposite to the side facing the piezoelectric substrate. The external terminals include an input terminal and an output terminal electrically connected to the boundary acoustic wave filter. The boundary acoustic wave filter includes a plurality of series-connected boundary acoustic wave elements. An interconnection line that electrically connects at least one pair of the neighboring series-connected boundary acoustic wave elements includes (a) at least one support layer line disposed on an upper surface of the cover and (b) at least one pair of via lines that pass through at least the support layer so as to connect the at least one support layer line to one of the at least one pair of the neighboring series-connected boundary acoustic wave elements and the other boundary acoustic wave element.

Such a structure reduces capacitive coupling between signal interconnection lines.

Preferably, the support layer line is formed by plating, for example.

According to preferred embodiments of the present invention, capacitive coupling between interconnection lines of a surface acoustic wave device or a boundary acoustic wave device is reduced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 10 is a top view of the surface acoustic wave device according to the fifth preferred embodiment of the present invention.

DETAILED DESCRIPTION OF PREFERRED EMBODIMENTS

Preferred embodiments of the present invention are described with reference to FIGS. 1 to 12.

First, surface acoustic wave devices according to first to fifth preferred embodiments are described with reference to FIGS. 1 to 11.

First Preferred Embodiment

A surface acoustic wave device 10 according to a first preferred embodiment is described with reference to FIGS. 1 to 6.

Figure 1:
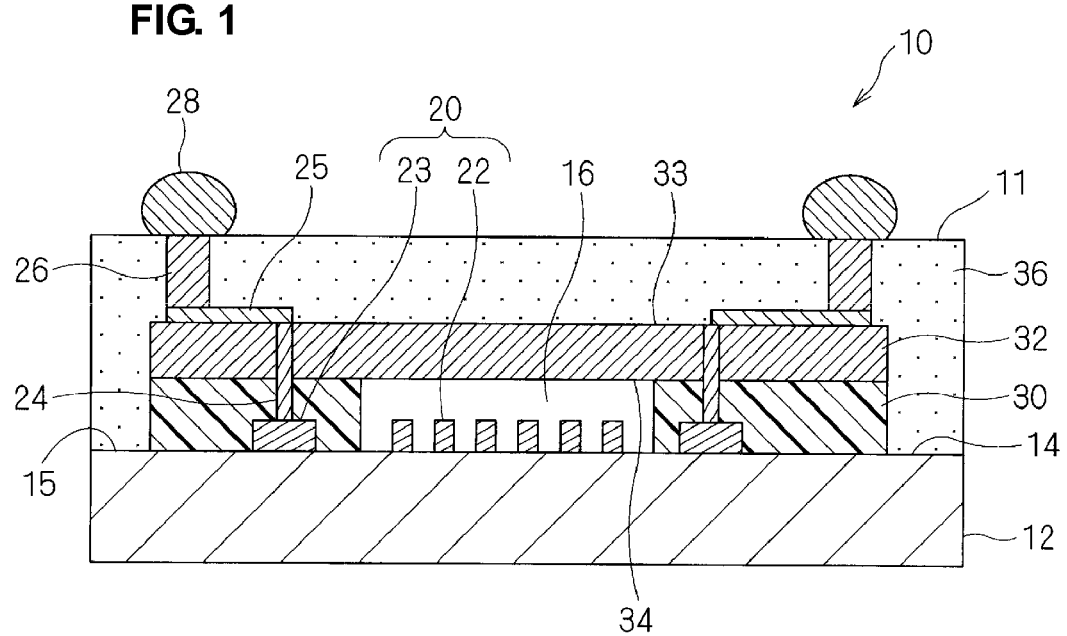
FIG. 1 is a cross-sectional view of a surface acoustic wave device according to a first preferred embodiment of the present invention.

As shown in a cross-sectional view of FIG. 1, the surface acoustic wave device 10 includes a conductive pattern 20 disposed on an upper surface 14 which is one of two major surfaces of a piezoelectric substrate 12. The conductive pattern 20 includes an IDT 22 and a pad 23. A cover 32 is disposed so as to face the upper surface 14 with a support layer 30 therebetween. A vibration space 16 is provided around the IDT 22. That is, the IDT 22 is disposed inside the support layer 30. Thus, surface acoustic waves can freely propagate in a portion of the piezoelectric substrate 12 adjacent to the vibration space 16. The support layer 30 is disposed inside a peripheral portion 15 of the upper surface 14 of the piezoelectric substrate 12.

In addition, a reinforcing resin 36 substantially entirely covers a portion from an upper surface 33 of the cover 32 to the peripheral portion 15 of the upper surface 14 of the piezoelectric substrate 12. An external electrode 28 is exposed through the reinforcing resin 36 so that the surface acoustic wave device 10 can be mounted on a circuit board of an electronic device.

Through-holes are provided in the cover 32 and the reinforcing resin 36. Conductor patterns 24 and 26 pass through the through-holes so that the pad 23 is connected to the external electrode 28. The conductor patterns 24 and 26 are connected to each other by a conductor pattern 25 provided on the upper surface 33 of the cover 32. Alternatively, although not shown, the conductor patterns 24 and 26 are directly connected to each other. The conductor patterns 24, 25, and 26 are formed by plating.

The reinforcing resin 36 extends along substantially the entire peripheral edge of the upper surface 14 of the piezoelectric substrate 12 of the surface acoustic wave device 10. Thus, the reinforcing resin 36 seals the upper surface 14 of the piezoelectric substrate 12. In this manner, the vibration space 16 is sealed and blocked from the external environment.

A plurality of the surface acoustic wave devices 10 can be produced at the same time in a substrate assembly. For example, the conductive pattern 20 is formed on the upper surface 14 of a wafer (a substrate assembly) made of one of LiTaO$_3$ and LiNbO$_3$ for the piezoelectric substrate 12 by, for example, vapor deposition of a metal film. Thereafter, the support layer 30 is formed using a photosensitive resin. A resin sheet member that defines the cover 32 is then bonded onto the support layer 30. Subsequently, the sheet member is cut into pieces, each defining the surface acoustic wave device 10 by, for example, a laser cutting process. After through-holes are formed in the sheet member and the support layer 30 so as to reach the pad 23, the conductor pattern 24 (a via interconnect line) is formed by plating. Furthermore, after the conductor pattern 25 is formed on the upper surface 33 of the cover 32 by plating, the reinforcing resin 36 is applied to the upper surface 14 of the wafer. Subsequently, a through-hole is formed in the reinforcing resin 36. When a photosensitive resin is used for the reinforcing resin, the through-hole is formed by a lithographic technique. In contrast, when a non-photosensitive resin is used for the reinforcing resin, the through-hole is formed by a laser process. The conductor pattern 26 is then formed in the through-hole formed in the reinforcing resin 36 by plating. Furthermore, the external electrodes 28 are formed by plating. Finally, the wafer is divided into pieces, each defining the surface acoustic wave device 10.

Figure 2:
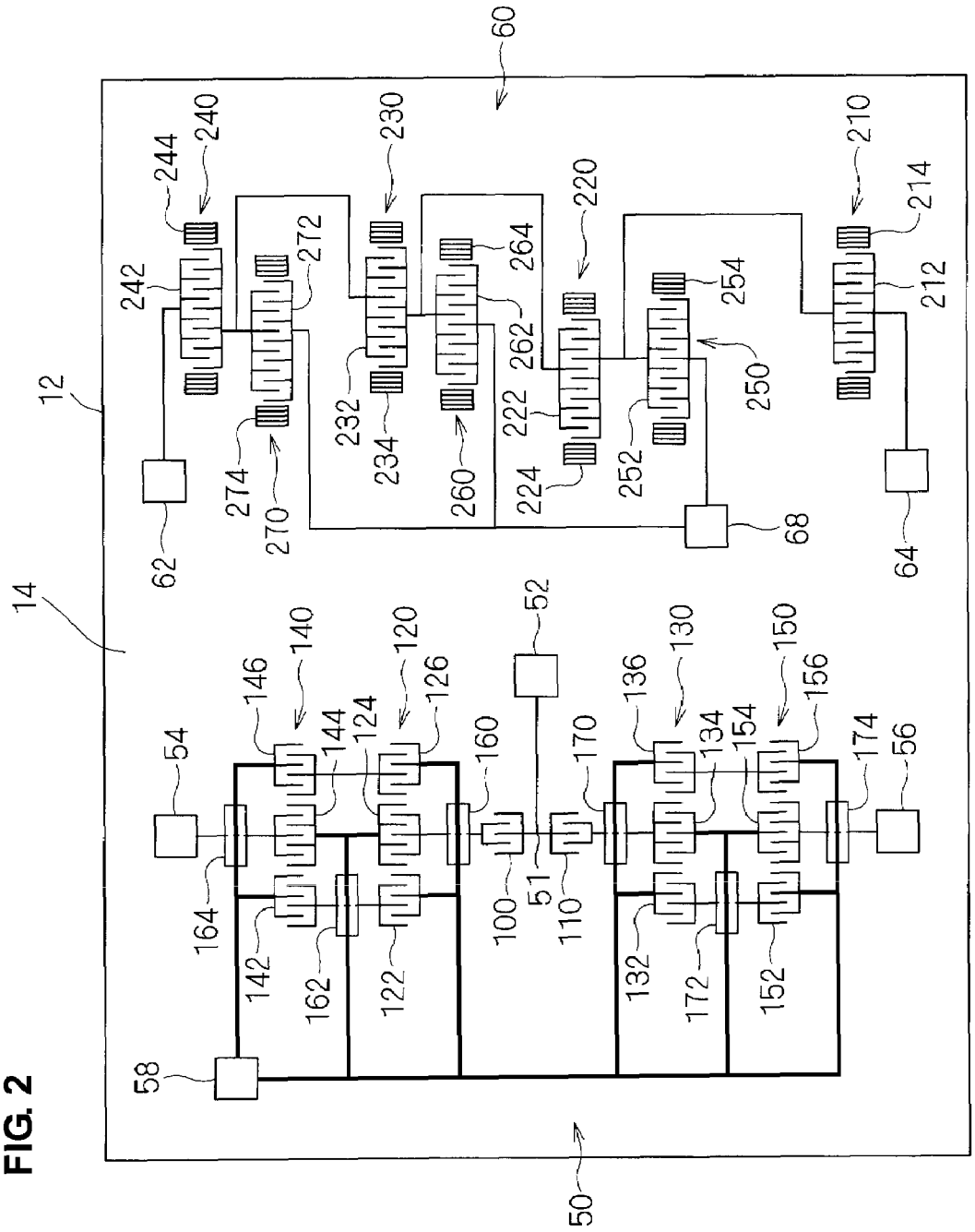
FIG. 2 is a configuration diagram of conductor patterns disposed on a piezoelectric substrate according to the first preferred embodiment of the present invention.

The surface acoustic wave device 10 functions as a duplexer. As schematically shown in FIG. 2, a reception surface acoustic wave filter 50, a transmission surface acoustic wave filter 60, and seven pads 52, 54, 56, 58, 62, 64, and 68 are formed on the upper surface 14 of the piezoelectric substrate 12.

The reception surface acoustic wave filter 50 functions as a balanced filter having a balanced-unbalanced conversion function. The reception surface acoustic wave filter 50 includes two resonators 100 and 110 and four longitudinally coupled resonator type surface acoustic wave filters 120, 130, 140, and 150. The longitudinally coupled resonator type surface acoustic wave filters 120, 130, 140, and 150 include three IDTs 122, 124, and 126; three IDTs 132, 134, and 136; three IDTs 142, 144, and 146; and three IDTs 152, 154, and 156, respectively. The three IDTs are disposed along a direction in which the surface acoustic waves propagate.

More specifically, one end of the resonator 100 and one end of the resonator 110 are connected to the reception antenna pad 52 in parallel. The IDTs 124 and 134, which are respectively middle IDTs of the longitudinally coupled resonator type surface acoustic wave filters 120 and 130, are connected to the other end of the resonator 100 and the other end of the resonator 110, respectively. The resonators 100 and 110 are used to improve frequency characteristics of the high side of the filtering band. However, the resonators 100 and 110 can be eliminated.

The longitudinally coupled resonator type surface acoustic wave filters 140 and 150 are longitudinally connected to the longitudinally coupled resonator type surface acoustic wave filters 120 and 130, respectively. Balanced signals having phases about 180 degrees different from each other are output from the balanced signal pads 54 and 56 connected to the IDTs 144 and 154, respectively, which are middle IDTs of the longitudinally coupled resonator type surface acoustic wave filters 140 and 150.

The ground interconnection line (shown by a heavy line in the drawing) connected to the ground pad 58 is formed on the upper surface 14 of the piezoelectric substrate 12 and insulating layers 160, 162, 164, 170, 172, and 174 formed on other interconnection lines. The ground interconnection intersect with the other interconnection lines when viewed from above.

Note that a reflector (not shown) may be provided on the resonators 100 and 110 and the longitudinally coupled resonator type surface acoustic wave filters 120, 130, 140, and 150 at a location outside the IDT.

The transmission surface acoustic wave filter 60 is a three-stage ladder filter. The transmission surface acoustic wave filter 60 includes seven resonators 210, 220, 230, 240, 250, 260, and 270. The resonators 210, 220, 230, 240, 250, 260, and 270 include IDTs 212, 222, 232, 242, 252, 262 and 272, respectively. Reflectors 214, 224, 234, 244, 254, 264, and 274 are disposed on both sides of the IDTs 212, 222, 232, 242, 252, and 272, respectively.

The reflectors 210, 220, 230, and 240 are connected in series between the transmission input pad 64 to which a transmission signal is input and the transmission antenna pad 62 connected to an antenna.

The resonators 250, 260, and 270 are connected in parallel between the neighboring resonators 210 and 220, between the neighboring resonators 220 and 230, and between the neighboring resonators 230 and 240, respectively. That is, one end of the resonator 250 is connected to the connection point between the series-connected resonators 210 and 220. The other end of the resonator 250 is connected to the ground pad 68. One end of the resonator 260 is connected to the connection point between the series-connected resonators 220 and 230. The other end of the resonator 260 is connected to the ground pad 68. One end of the resonator 270 is connected to the connection point between the series-connected resonators 230 and 240. The other end of the resonator 270 is connected to the ground pad 68.

Figure 3:
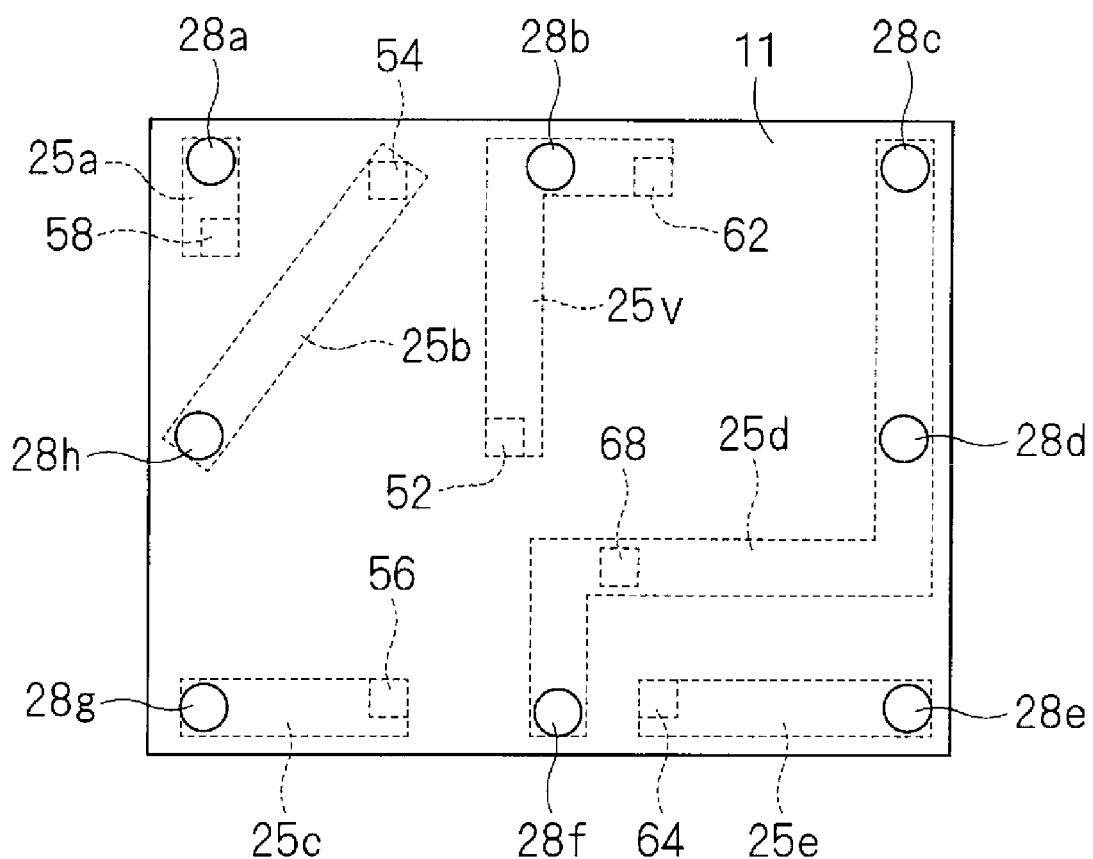
FIG. 3 is a top view of the surface acoustic wave device according to the first preferred embodiment of the present invention.

As shown in a plan view in FIG. 3, eight external electrodes 28a to 28h defining the external electrodes 28 (see FIG. 1) are provided on an upper surface 11 of the surface acoustic wave device 10 (see FIG. 1). Conductor patterns 25a to 25e and a conductor pattern 25v shown by dotted lines are provided on an upper surface 33 of the cover 32 so as to define the conductor pattern 25 (see FIG. 1). The conductor patterns 25a to 25e, the conductor pattern 25v, and the conductor patterns 24 and 26 electrically connect the external electrodes 28a to 28h to the pads 52, 54, 56, 58, 62, 64, and 68.

The external electrode 28b defines an antenna terminal connected to the reception antenna pad 52 of the reception surface acoustic wave filter 50 and the transmission antenna pad 62 of the transmission filter 60. The external electrode 28e is connected to the transmission input pad 64 of the transmission surface acoustic wave filter 60 and defines a transmission input terminal. The external electrode 28g is connected to the balanced signal pad 56 defining a balanced signal terminal of the reception surface acoustic wave filter 50. The external electrode 28h is connected to the balanced signal pad 54 defining a balanced signal terminal of the reception surface acoustic wave filter 50. The external electrodes 28g and 28h define reception output terminals.

The conductor pattern 25v is a portion of an interconnection line between an input end 51 of the reception surface acoustic wave filter 50 (see FIG. 2) and the antenna terminal (the external electrode 28b). Since the interconnection line includes the conductor pattern 25v (a cover interconnection line), the capacitive coupling between the interconnection lines is reduced, and therefore, the isolation is improved.

That is, LiTaO$_3$ and LiNbO$_3$ used for the piezoelectric substrate 12 of the surface acoustic wave device 10 have a relative permittivity as high as about 40 to 50. Accordingly, in the one-chip surface acoustic wave device 10, if interconnection lines are disposed on the piezoelectric substrate 12, the capacitive coupling between the interconnection lines is increased. In particular, as the size of the chip is reduced using a wafer-level chip-size packaging technology, the affect of the capacitive coupling increases. Thus, the isolation characteristic deteriorates.

Therefore, portions of the interconnection lines are moved onto the cover 32 made of resin or glass having a relative permittivity less than that of the piezoelectric substrate 12, and interconnection is made on the cover 32. In this manner, the increase in capacitive coupling on the piezoelectric substrate 12 is prevented. Thus, even when the size of the chip is reduced, an excellent diplexing characteristic can be obtained with an excellent isolation characteristic.

Comparative Example

A comparative example of a surface acoustic wave filter is described next with reference to FIGS. 4 and 5. Similar numbering will be used in describing FIGS. 4 and 5 as was utilized above in the first preferred embodiment, and only differences from those of the first preferred embodiment are described below.

Figure 4:
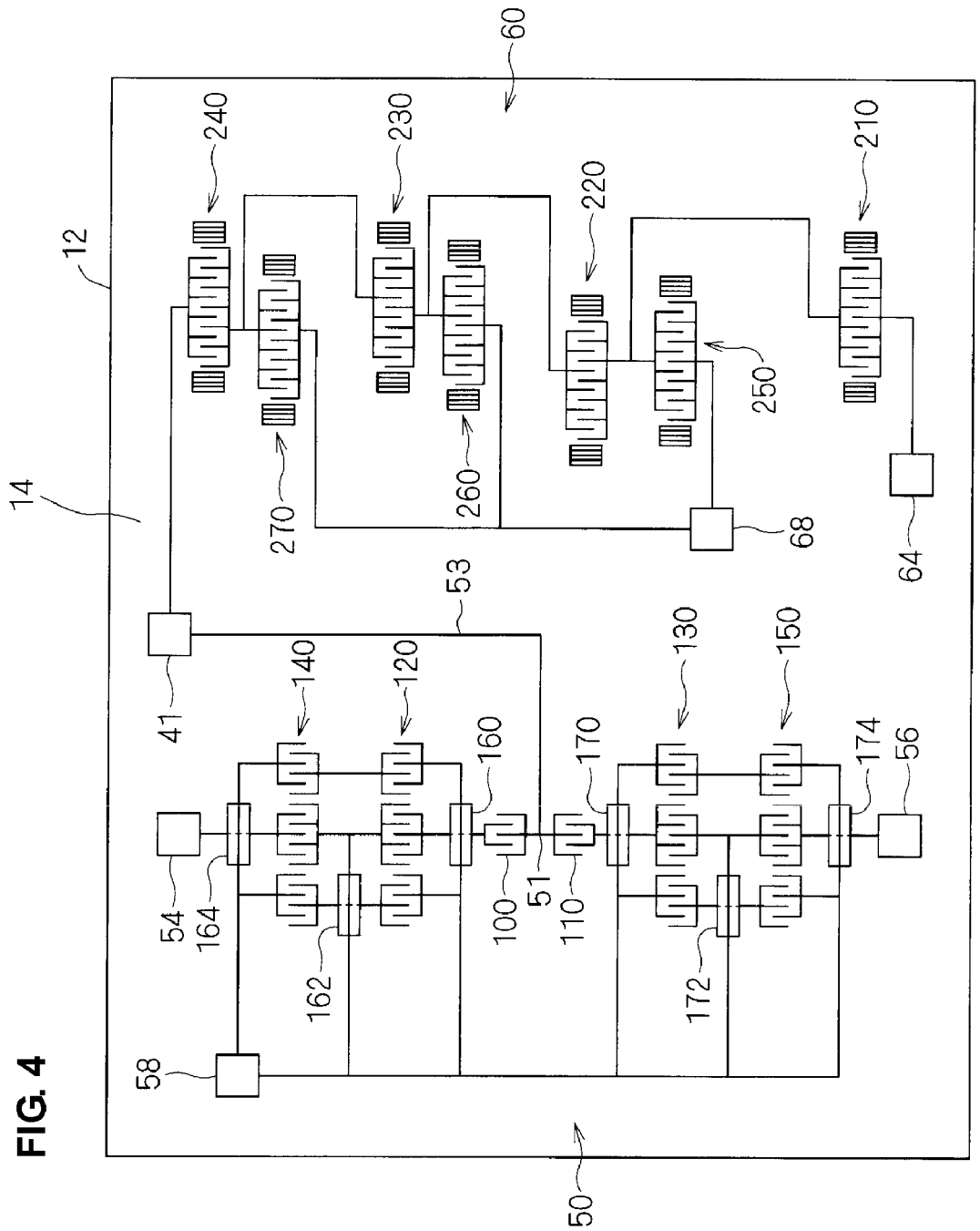
FIG. 4 is a configuration diagram of conductor patterns disposed on a piezoelectric substrate according to a comparative example.
Figure 5:
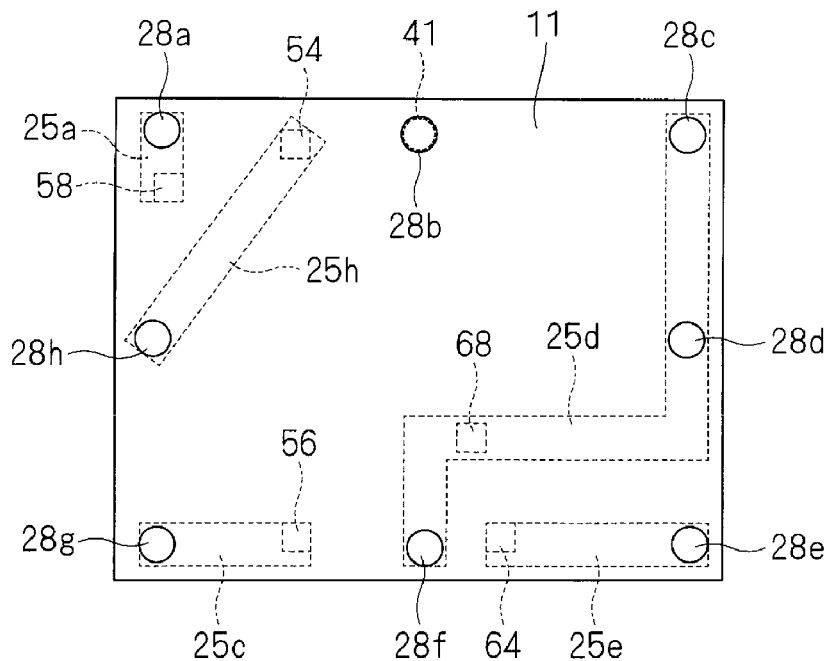
FIG. 5 is a top view of a surface acoustic wave device according to the comparative example.

FIG. 4 is a configuration diagram of a conductor pattern provided on the upper surface 14 of the piezoelectric substrate 12. FIG. 5 is a top view of a surface acoustic wave device. FIGS. 4 and 5 correspond to FIGS. 2 and 3 of the first preferred embodiment, respectively.

In the comparative example, a portion of an interconnection line is provided on the piezoelectric substrate 12. That is, as shown in FIG. 4, the input end 51 of the reception surface acoustic wave filter 50 is connected, using an interconnection line 53 disposed on the piezoelectric substrate 12, to a common antenna pad 41 connected to the transmission surface acoustic wave filter 60. As shown in FIG. 5, the common antenna pad 41 is disposed immediately beneath the external electrode 28b connected to an antenna.

Comparison Between Isolation Characteristics

Figure 6:
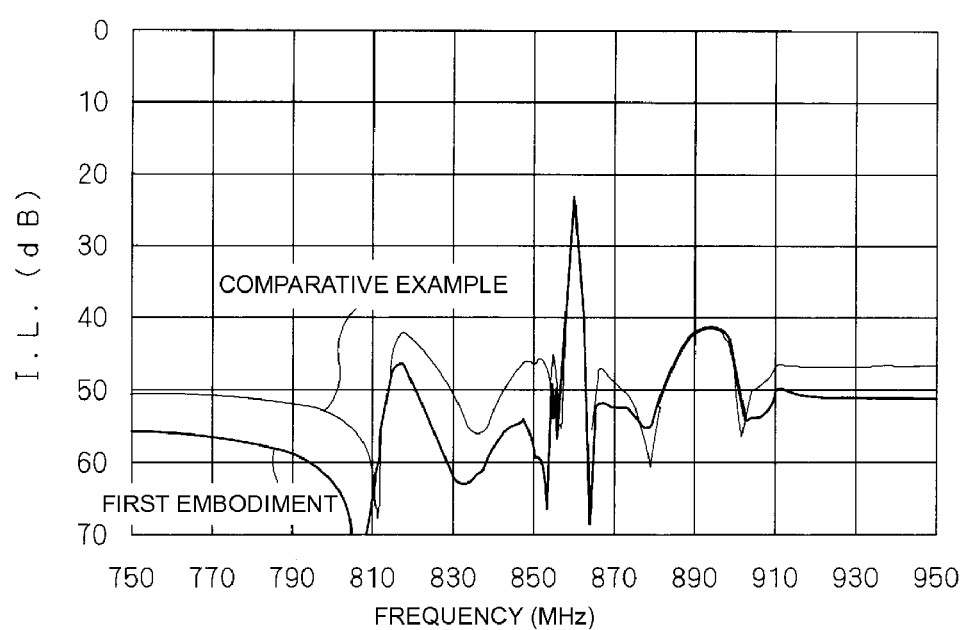
FIG. 6 is a graph illustrating the isolation characteristics of the first preferred embodiment of the present invention and the comparative example.

FIG. 6 is a graph of the isolation characteristic. The heavy line represents the isolation characteristic of the surface acoustic wave device 10 according to the first preferred embodiment. The thin line represents the isolation characteristic of a surface acoustic wave device 10 of the comparative example. The two surface acoustic wave devices have the same transmission frequency range of about 824 MHz to about 849 MHz and the same reception frequency range of about 869 MHz to about 894 MHz. As shown in FIG. 6, the isolation characteristic of the first preferred embodiment is improved as compared to that of the comparative example.

Second Preferred Embodiment

According to a second preferred embodiment, a surface acoustic wave device has a structure that is substantially the same as that of the first preferred embodiment. However, the second preferred embodiment differs from the first preferred embodiment in that a portion of an interconnection line (e.g., at least one half of the interconnection line) between the input end 51 of the reception surface acoustic wave filter 50 (see FIG. 2) and an antenna terminal (the external electrode 28b) is disposed on a lower surface 34 of the cover 32, not the upper surface 33 of the cover 32. According to the second preferred embodiment, a conductor pattern corresponding to the conductor pattern 25v is provided on the lower surface 34 of the cover 32 in advance. Subsequently, the cover 32 is disposed so as to face the piezoelectric substrate 12. The cover 32 is then joined to the piezoelectric substrate 12 using the support layer 30. Similar to the first preferred embodiment, according to the second preferred embodiment, the capacitive coupling is reduced. Thus, the isolation characteristic is improved.

Third Preferred Embodiment

Figure 7:
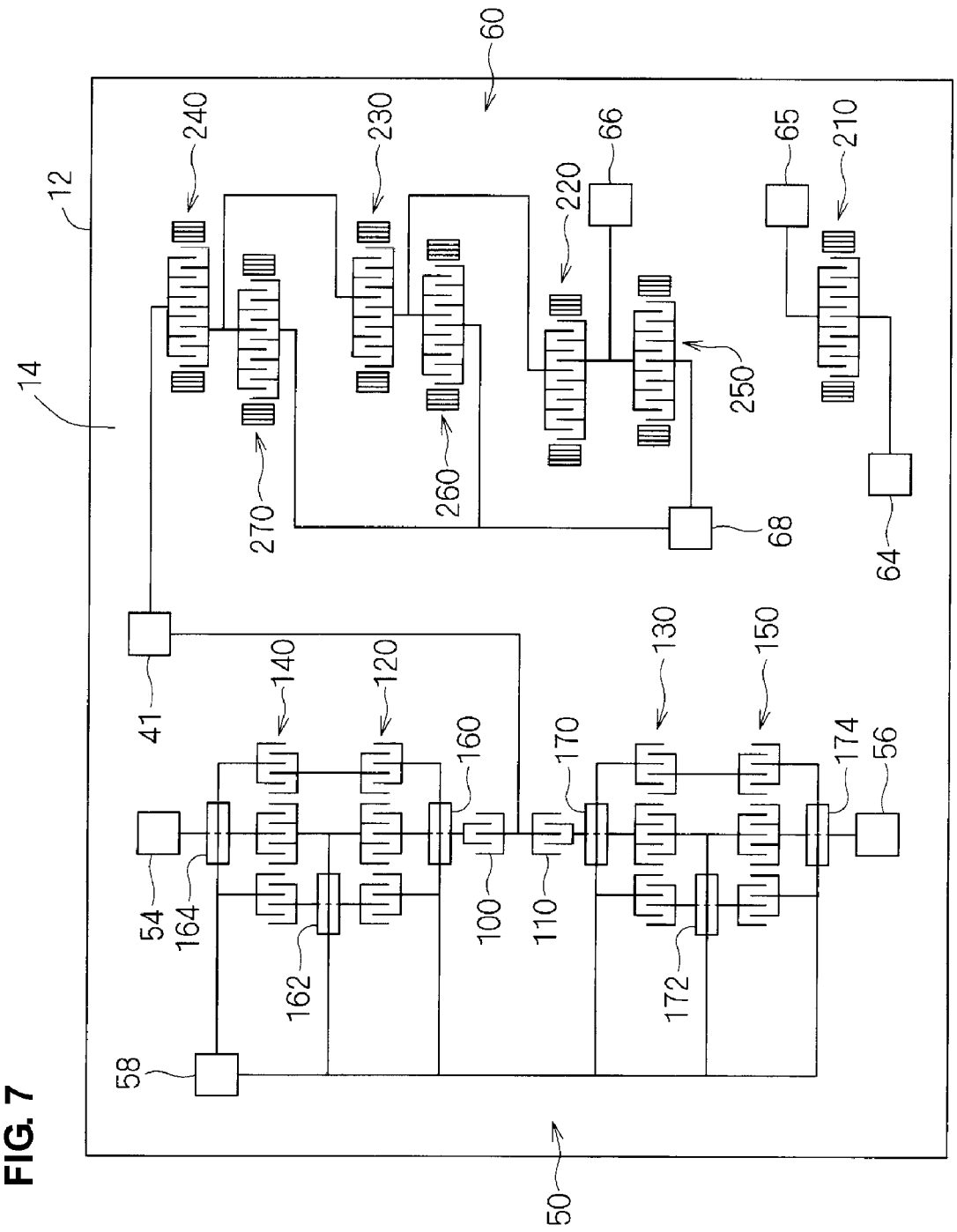
FIG. 7 is a configuration diagram of conductor patterns disposed on a piezoelectric substrate according to a third preferred embodiment of the present invention.

A surface acoustic wave device according to a third preferred embodiment is described next with reference to FIG. 7. FIG. 7 is a configuration diagram of a conductor pattern disposed on the upper surface 14 of the piezoelectric substrate 12. FIG. 7 corresponds to FIG. 2 of the first preferred embodiment.

According to the third preferred embodiment, a surface acoustic wave device has a structure substantially the same as that of the first preferred embodiment. A reception surface acoustic wave filter 50 and a transmission surface acoustic wave filter 60 are disposed on the piezoelectric substrate 12.

However, the surface acoustic wave device according to the third preferred embodiment differs from that of the first preferred embodiment in that the reception surface acoustic wave filter 50 and the transmission surface acoustic wave filter 60 are connected to the common antenna pad 41, and a portion of the interconnection line of the transmission surface acoustic wave filter 60 is disposed on the cover 32.

That is, an interconnection line between the resonators 210 and 220 is separated. The resonators 210 and 220 are connected to relay pads 65 and 66, respectively. The relay pad 65 is electrically connected to the relay pad 66 using a conductor pattern (not shown) formed on the upper surface 33 or the lower surface 34 of the cover 32.

Signal lines of the transmission surface acoustic wave filter 60 are connected on the cover 32 and are separated on the piezoelectric substrate 12. In this manner, the capacitive coupling between the interconnection lines is reduced. Thus, the isolation characteristic is improved.

Even when any one of the interconnection lines among the interconnection lines between the neighboring resonators 210 and 220, between the neighboring resonators 220 and 230, and between the neighboring resonators 230 and 240 is disposed on the cover 32, the isolation characteristic can be improved. However, similar to the third preferred embodiment, when a portion of the interconnection line closest to the transmission input pad 64 and having the highest signal level is disposed on the cover, the advantage is maximized. Thus, this configuration is the most preferable.

Alternatively, the interconnection line between the resonators 210 and 220 may be disposed on the lower surface 34 of the cover 32, and the interconnection line between the reception surface acoustic wave filter 50 and the common antenna pad 41 may be disposed on the upper surface 33 of the cover 32. Even in such a structure, the capacitive coupling between the signal lines is reduced.

Fourth Preferred Embodiment

Figure 8:
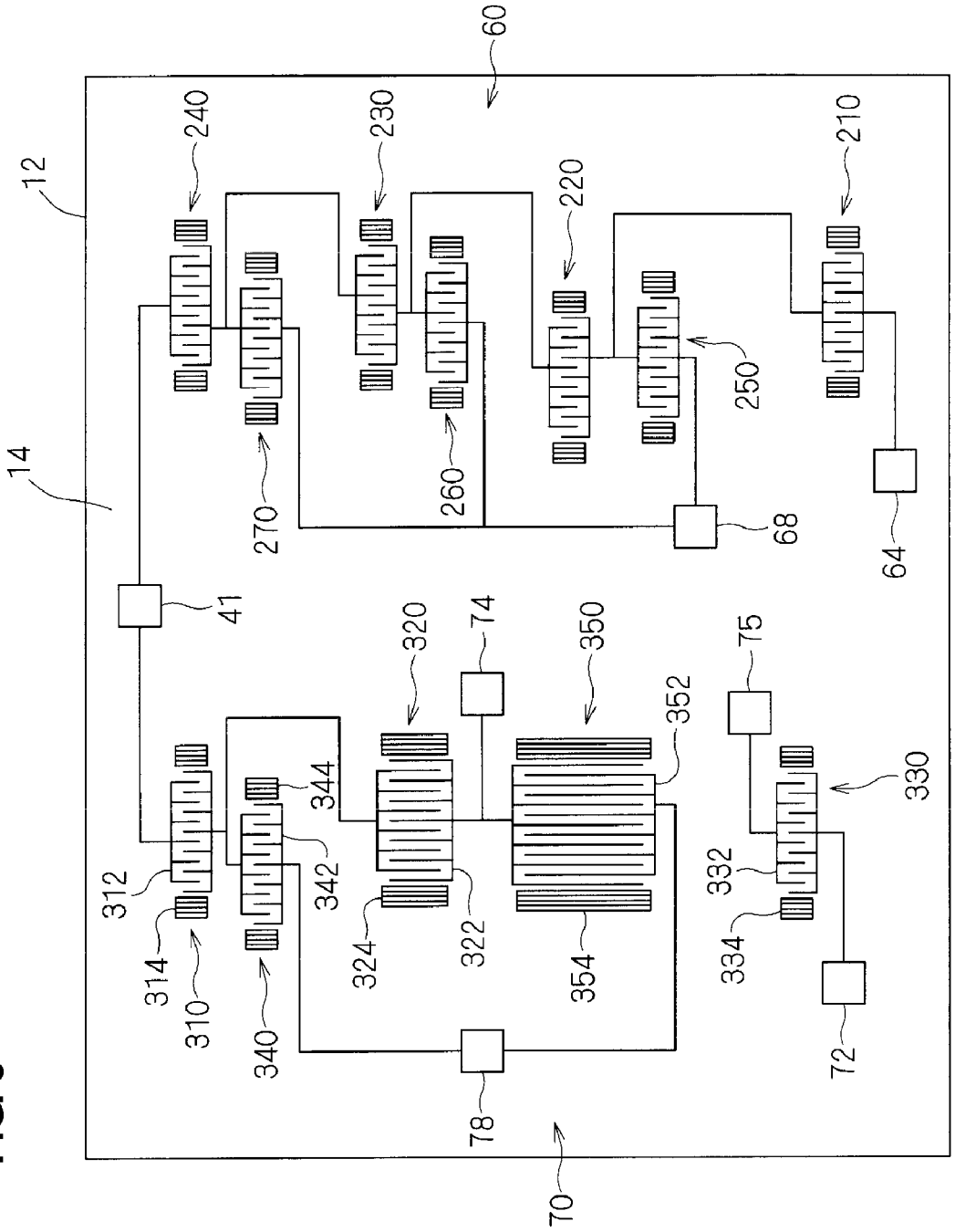
FIG. 8 is a configuration diagram of conductor patterns disposed on a piezoelectric substrate according to a fourth preferred embodiment of the present invention.

A surface acoustic wave device according to a fourth preferred embodiment is described next with reference to FIG. 8. FIG. 8 is a configuration diagram of a conductor pattern disposed on the upper surface 14 of the piezoelectric substrate 12. FIG. 8 corresponds to FIG. 2 of the first preferred embodiment.

According to the fourth preferred embodiment, a surface acoustic wave device has a structure substantially the same as that of the first preferred embodiment. A reception surface acoustic wave filter 70 and a transmission surface acoustic wave filter 60 are disposed on the piezoelectric substrate 12.

However, the surface acoustic wave device according to the fourth preferred embodiment differs from that of the first preferred embodiment in that the reception surface acoustic wave filter 70 and the transmission surface acoustic wave filter 60 are connected to the common antenna pad 41, and a portion of the interconnection line of the reception surface acoustic wave filter 70 is disposed on the cover 32. In addition, unlike the first preferred embodiment, the reception surface acoustic wave filter 70 is a ladder type surface acoustic wave filter.

The reception surface acoustic wave filter 70 is a two-stage ladder filter. The reception surface acoustic wave filter 70 includes five resonators 310, 320, 330, 340, and 350. The resonators 310, 320, 330, 340, and 350 include IDTs 312, 322, 332, 342, and 352, respectively. Reflectors 314, 324, 334, 344, and 354 are disposed on both sides of the IDTs 312, 322, 332, 342, and 352, respectively.

The resonators 310, 320, and 330 are connected in series between the common antenna pad 41 and a reception output pad 72. The resonator 320 is separated from the resonator 330 on the piezoelectric substrate 12. The resonators 320 and 330 are connected to relay pads 74 and 75, respectively. The relay pad 74 is electrically connected to the relay pad 75 using a conductor pattern disposed on the cover 32.

The resonator 340 is connected in parallel between the neighboring resonators 310 and 320, and the resonator 350 is connected in parallel between the resonators 320 and 330. That is, one end of the resonator 340 is connected to the connection point between the series-connected resonators 310 and 320. The other end of the resonator 340 is connected to an ground pad 78. One end of the resonator 350 is connected to the connection point between the series-connected resonators 320 and 330. The other end of the resonator 350 is connected to the ground pad 78.

In the surface acoustic wave device according to the fourth preferred embodiment, a portion of the interconnection line between the resonators 320 and 330 is disposed on the cover 32. Thus, capacitive coupling between the interconnection lines is reduced as compared to the case in which substantially the entire interconnection line between the resonators 320 and 330 is disposed on the piezoelectric substrate 12. Therefore, the isolation is improved.

In addition, even when a portion of the interconnection line between the resonators 310 and 320 is disposed on the cover 32 instead of the interconnection line between the resonators 320 and 330, the isolation is improved. However, similar to the fourth preferred embodiment, it is preferable that the interconnection line between the resonators 320 and 330 that is close to the reception output pad 72 is separated on the piezoelectric substrate 12, since the advantage is maximized. The interconnection line between the resonators 320 and 330 tends to be easily affected by noise on the transmission side caused by attenuation of a reception signal.

Fifth Preferred Embodiment

Surface acoustic wave devices 10x to 10z according to the fifth preferred embodiment are described with reference to FIGS. 9 to 11C.

Figure 11A:
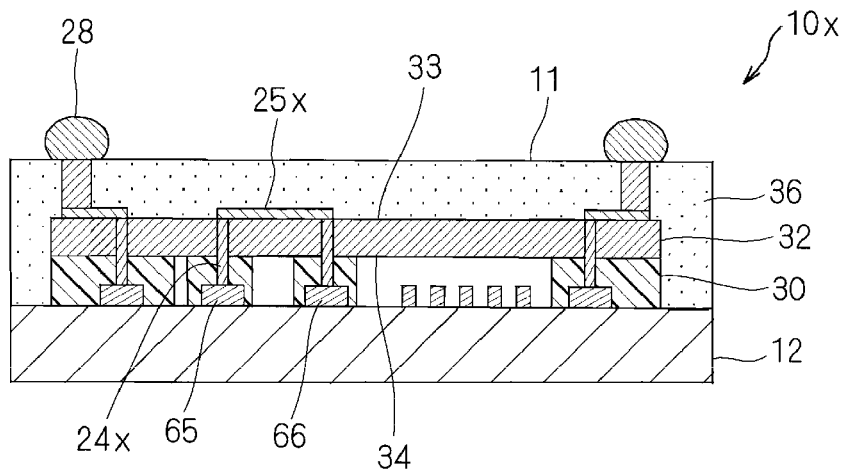
FIGS. 11A to 11C are cross-sectional views of the surface acoustic wave device according to the fifth preferred embodiment of the present invention.
Figure 11B:
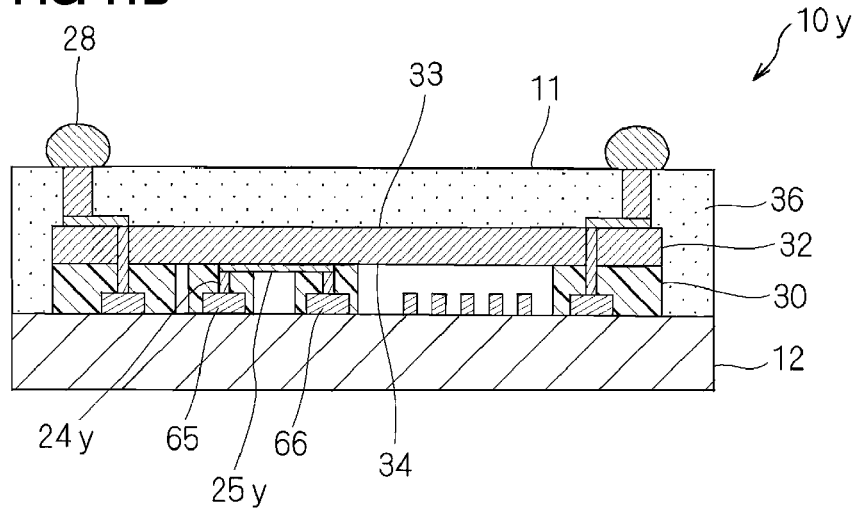
Figure 11C:
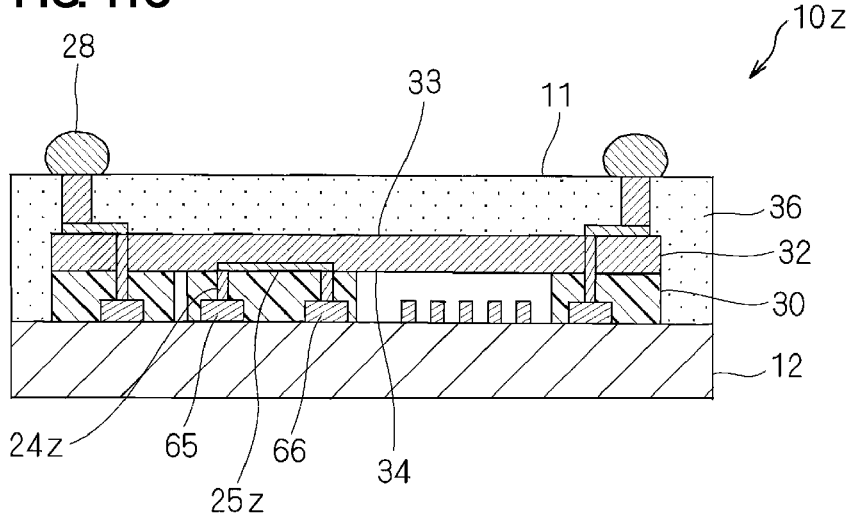

As shown by cross-sectional views in FIGS. 11A to 11C, the surface acoustic wave devices 10x to 10z according to the fifth preferred embodiment have a structure similar to that of the first preferred embodiment. Each of the surface acoustic wave devices 10x to 10z includes a piezoelectric substrate 12, a support layer 30, a reinforcing resin 36, and an external electrode 28. However, as shown in FIGS. 9 and 10, the fifth preferred embodiment differs from the first preferred embodiment in that each of the surface acoustic wave devices 10x to 10z is a filter including only a pair of surface acoustic wave filters 80.

Figure 9:
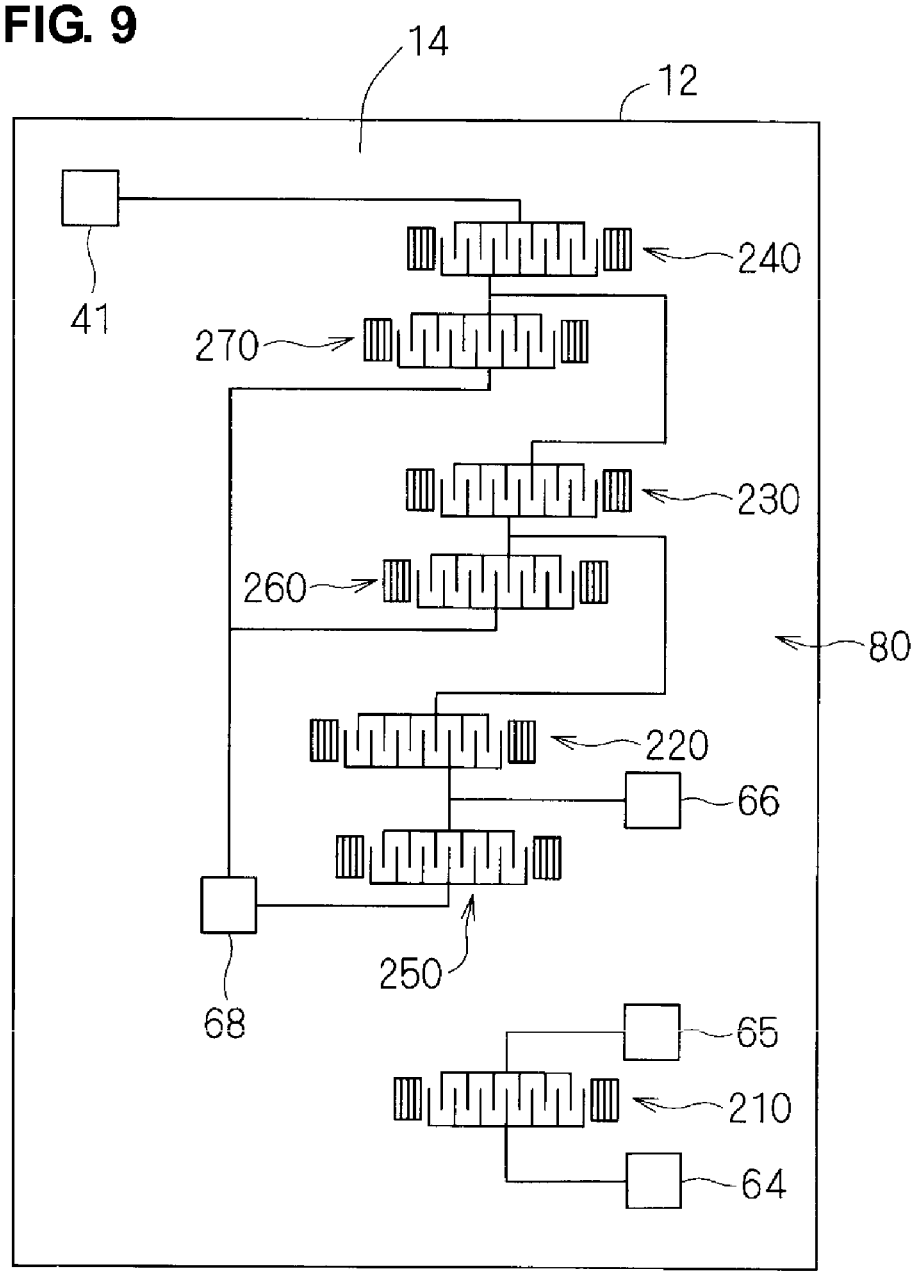
FIG. 9 is a configuration diagram of conductor patterns disposed on a piezoelectric substrate according to a fifth preferred embodiment of the present invention.

That is, as shown in FIG. 9, the acoustic wave filters 80 and pads 41, 64, 65, 66, and 68 are disposed on an upper surface 14 of the piezoelectric substrate 12. Similar to the transmission surface acoustic wave filter 60 of the first preferred embodiment, the acoustic wave filter 80 is a three-stage ladder filter including seven resonators 210, 220, 230, 240, 250, 260, and 270.

As shown in FIG. 10, four external electrodes 28p to 28s defining the external electrodes 28 are provided on an upper surface 11 (see FIGS. 11A to 11C) of each of the surface acoustic wave devices 10x to 10z. The external electrode 28r defines an input terminal. The external electrode 28p defines an output terminal. The external electrodes 28q and 28s define GND terminals.

As shown by a dashed line in FIG. 10, conductor patterns 25q, 25r, and 25s and one of conductor patterns 25x, 25y, and 25z are disposed on the upper surface 33 or the lower surface 34 (see FIG. 11) of the cover 32. The conductor pattern 25q is a portion of an interconnection line that electrically connects the external electrode 28q to the pad 68. The conductor pattern 25r is a portion of an interconnection line that electrically connects the external electrode 28r to the pad 64. The conductor pattern 25s is a portion of an interconnection line that electrically connects the external electrode 28s to the pad 68. As shown in FIGS. 10 and 11, each of the conductor patterns 25x, 25y, and 25z is a portion of an interconnection line (a cover interconnection line) that electrically connects the pad 65 to the pad 66.

As shown in FIG. 11A, when the conductor pattern 25x is provided on the upper surface 33 of the cover 32, the conductor pattern 25x is formed, together with the conductor patterns 25q to 25s (see FIG. 10), by plating. Subsequently, the conductor pattern 25x is connected to a conductor pattern 24x (a via interconnection line) that passes through the support layer 30 and the cover 32.

As shown in FIGS. 11B and 11C, when the conductor pattern 25y or 25z is provided on the lower surface 34 of the cover 32, the support layer 30 is formed by using a photosensitive resin first. Thereafter, a through-hole is formed in the support layer 30 by a laser process. Subsequently, a conductive pattern 24y or 24z (a via interconnection line) is formed by, for example, plating.

In FIG. 11B, a conductor pattern defining the conductor pattern 25y is formed on a surface serving as the lower surface 34 of a resin sheet member serving as the cover 32 in advance. Subsequently, a resin sheet member defining the cover 32 is bonded onto the support layer 30. At that time, the conductor pattern 25y is connected to the conductive pattern 24y that passes through the support layer 30.

In FIG. 11C, a conductor pattern defining the conductor pattern 25z is formed on an upper surface of the support layer 30. At that time, the conductor pattern 25z is connected to the conductive pattern 24z that passes through the support layer 30. Subsequently, a resin sheet member defining the cover 32 is bonded onto the support layer 30.

In the surface acoustic wave devices 10x to 10z, one of the conductor patterns 25x, 25y, and 25z (cover interconnection lines) is disposed on the upper surface 33 or the lower surface 34 of the cover 32. The pad 65 is connected to the pad 66 using an interconnection line partially extending on the cover 32. In this manner, capacitive coupling between interconnection lines is reduced as compared to the case in which the connection point between the resonators 220 and 250 is connected to the resonator 210 using only an interconnection line disposed on the piezoelectric substrate 12. Thus, the VSWR of a filter is improved.

Furthermore, a portion of an interconnection line used for longitudinally connecting two longitudinally coupled resonator type surface acoustic wave filters to each other can be disposed on the cover. In such a case, capacitive coupling between interconnection lines is reduced as compared to the case in which two longitudinally coupled resonator type surface acoustic wave filters are connected to each other using only an interconnection line disposed on the piezoelectric substrate. Thus, the VSWR of a filter is improved.

A surface acoustic wave element functions as a surface acoustic wave resonator or a longitudinally coupled resonator type surface acoustic wave filter.

Boundary acoustic wave devices according to sixth to tenth preferred embodiments are described next.

Sixth Preferred Embodiment

A boundary acoustic wave device 500 according to a sixth preferred embodiment is described with reference to FIG. 12.

Figure 12:
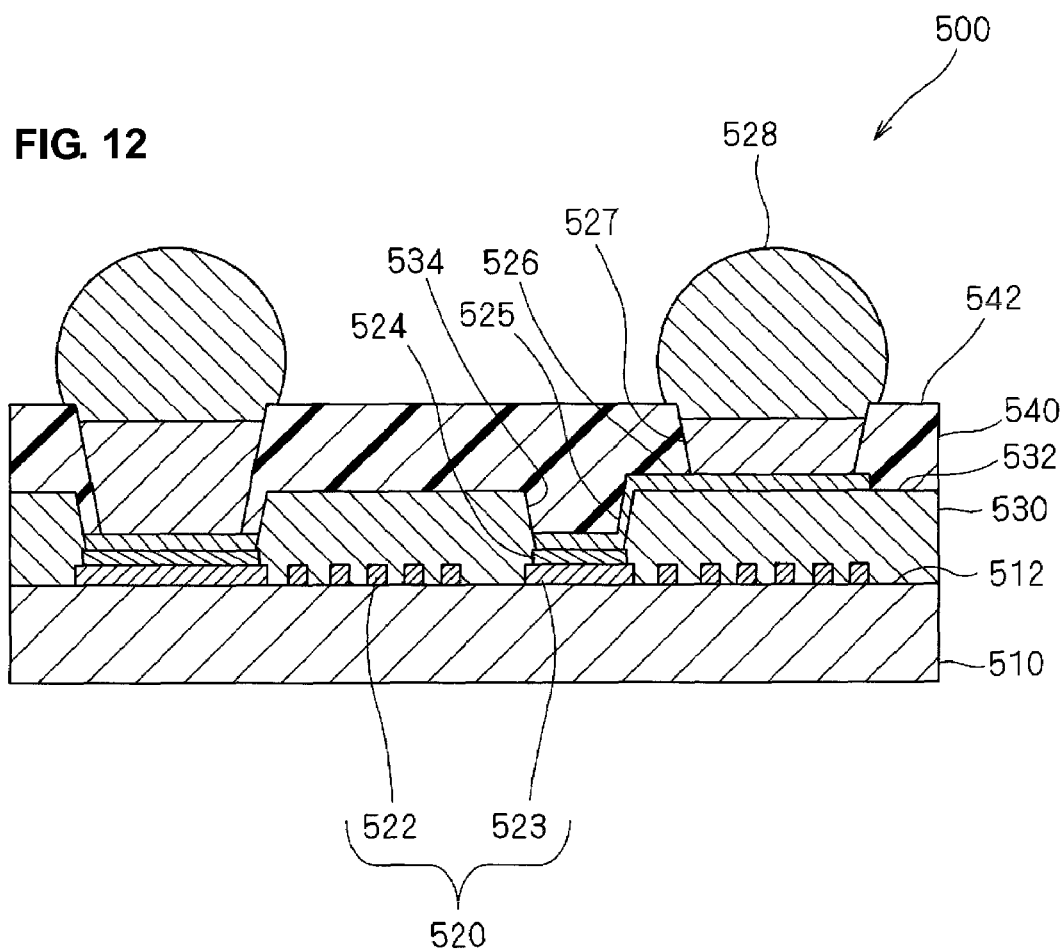
FIG. 12 is a cross-sectional view of a boundary acoustic wave device according to a sixth preferred embodiment of the present invention.
Figure 13:
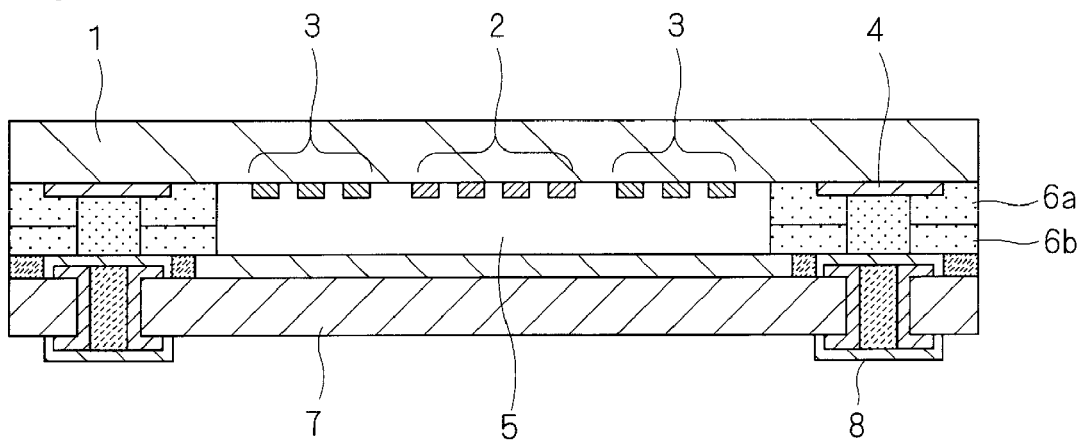
FIG. 13 is a cross-sectional view of a surface acoustic wave device according to the related art.

As shown by a cross-sectional view in FIG. 12, the boundary acoustic wave device 500 includes a piezoelectric substrate 510 made of $LiNbO_3$, for example, and a Au conductor pattern 520 provided on an upper surface 512 of the piezoelectric substrate 510. The conductor pattern 520 includes an IDT 522 and a pad 523. An adhesive layer 524 made of Ti, for example, is provided on the pad 523. A support layer 530 made of $SiO_2$, for example, is disposed on the upper surface 512 of the piezoelectric substrate 510 and the conductor pattern 520. The support layer 530 is partially removed using a photolithography technique so that the adhesive layer 524 of the pad 523 is exposed. Thus, a via (a through-hole) 534 is formed. At the same time, a support layer interconnection line 526 is formed on an upper surface 532 of the support layer 530, and a via interconnection line 525 is formed in the via 534 by, for example, plating. One end of the support layer interconnection line 526 is connected to the adhesive layer 24 of the pad 523 using the via interconnection line 525 that passes through the support layer 530.

A cover 540 is formed on the upper surface 532 of the support layer 530 and the support layer interconnection line 526. The cover 540 is made from a sound absorbing material, such as an epoxy resin, for example, in order to attenuate vibration in a spurious mode that propagates in the support layer 530.

The cover 540 is partially removed by sandblasting. Removed portions of the cover 540 are filled with an under bump metal 527 by plating. A solder bump 528 is formed on the under bump metal 527. The solder bump 528 defines an external electrode protruding from an upper surface 542 of the cover 540.

The boundary acoustic wave device 500 converts boundary acoustic waves into an electrical signal using boundary acoustic waves propagating a boundary between the piezoelectric substrate 510 made of $LiNbO_3$, which is a first medium, and the support layer 530 made of $SiO_2$, which is a second medium. As shown in FIG. 1, the surface acoustic wave device requires the vibration space 16 around the IDT 22. However, as shown in FIG. 12, in the boundary acoustic wave device 500, the IDT 522 is disposed on an interface between the piezoelectric substrate 510 and the support layer 530. Thus, a vibration space is not required around the IDT 522.

The boundary acoustic wave device 500 defines a duplexer. A method for designing an IDT electrode that is substantially the same as that for the surface acoustic wave device 10 of the first preferred embodiment can be applied to the boundary acoustic wave device 500. That is, conductor patterns similar to those of FIG. 2 are formed on the upper surface 512 of the piezoelectric substrate 510. Thus, a reception surface acoustic wave filter 50, a transmission surface acoustic wave filter 60, and seven pads 52, 54, 56, 58, 62, 64, and 68 are formed. In the sixth preferred embodiment, the filters 50 and 60 shown in FIG. 2 are boundary acoustic wave filters. The reception surface acoustic wave filter 50 is a boundary acoustic wave filter of a balanced type.

The arrangement of the interconnection lines is also similar to that of the first preferred embodiment. A portion of an interconnection line between the input end 51 (see FIG. 2) of the reception filter 50 and an antenna terminal defining an external electrode is formed on the upper surface 532 of the support layer 530. That is, a portion of the interconnection line is formed from the support layer interconnection line 526.

$LiTaO_3$ and $LiNbO_3$ used for the piezoelectric substrate 510 of the boundary acoustic wave device 500 have a relative permittivity as high as about 40 to about 50. Accordingly, in the one-chip boundary acoustic wave device 500, if interconnection lines are disposed on the piezoelectric substrate 510, the capacitive coupling between the interconnection lines is increased. In particular, as the size of the chip is reduced using a wafer-level chip-size packaging technology, the affect of the capacitive coupling increases. Thus, the isolation characteristic deteriorates.

According to the sixth preferred embodiment, the support layer 530 of the boundary acoustic wave device 500 is made of SiO₂ having a relative permittivity of about 3 to about 5. In addition, as described above, a portion of an interconnection line between the input end 51 of the reception filter 50 (see FIG. 2) and the antenna terminal defining an external electrode is disposed on the upper surface 532 of the support layer 530.

As compared to the case in which the portion of an interconnection line between the input end 51 (see FIG. 2) of the reception filter 50 and the antenna terminal defining an external electrode is disposed on the piezoelectric substrate 510, if a portion of an interconnection line is disposed on the support layer 530 made of a dielectric material having a low relative permittivity, an increase in the capacitive coupling between interconnection lines is prevented. Accordingly, even when the size of the chip is reduced, the isolation characteristic is improved.

Seventh Preferred Embodiment

According to a seventh preferred embodiment, a boundary acoustic wave device has a structure substantially the same as that of the sixth preferred embodiment. However, the arrangement of interconnection lines of the seventh preferred embodiment differs from that of the sixth preferred embodiment. That is, the seventh preferred embodiment differs from the sixth preferred embodiment only in the following point: a portion of an interconnection line between the input end 51 (see FIG. 2) of the reception filter 50 and the antenna terminal defining an external electrode is disposed on the upper surface 542 of the cover 540, not on the upper surface 532 of the support layer 530. Similar to the sixth preferred embodiment, according to the seventh preferred embodiment, the capacitive coupling between interconnection lines is reduced, and therefore, the isolation characteristic is improved.

Eighth Preferred Embodiment

According to an eighth preferred embodiment, a boundary acoustic wave device has a structure substantially the same as that of the sixth preferred embodiment. However, unlike the sixth preferred embodiment, conductor patterns disposed on the upper surface 512 of the piezoelectric substrate 510 are formed in the same manner as in the surface acoustic wave device of the third preferred embodiment. The interconnection lines are arranged in the same manner as in the third preferred embodiment.

That is, similar to the third preferred embodiment shown in FIG. 7, conductor patterns are disposed on the upper surface 512 of the piezoelectric substrate 510 so that an interconnection line between the resonators 210 and 220 is separated, and the resonators 210 and 220 are connected to the relay pads 65 and 66, respectively. In the eighth preferred embodiment, the filters 50 and 60 shown in FIG. 7 are boundary acoustic wave filters. The resonators 210, 220, 230, and 240 of the transmission filter 50 are boundary acoustic wave resonators. The relay pad 65 is electrically connected to the relay pad 66 using a via interconnection line 525 that passes through the support layer 530 and the support layer interconnection line 526 disposed on the upper surface 532 of the support layer 530.

By connecting signal lines of the transmission filter 60 on the support layer 530 and separating the signal line on the piezoelectric substrate 510, the capacitive coupling between interconnection lines is reduced, and therefore, the isolation characteristic is improved.

Note that, even when a portion of any one of the interconnection lines between pairs of the neighboring resonators 210, 220, 230, and 240 is disposed on the support layer 530, the isolation characteristic is improved. However, similar to the third preferred embodiment, when a portion of the interconnection line closest to the transmission input pad 64 and having the highest signal level is disposed on the cover, the advantages are maximized. Thus, this configuration is the most preferable.

Alternatively, the interconnection line between the resonators 210 and 220 may be disposed on the upper surface 542 of the cover 540, and the interconnection line between the reception filter 50 and the common antenna pad 41 may be disposed on the upper surface 542 of the cover 540. Even in such a structure, the capacitive coupling between the signal lines is reduced.

Ninth Preferred Embodiment

According to a ninth preferred embodiment, a boundary acoustic wave device has a structure substantially the same as that of the sixth preferred embodiment. However, unlike the sixth preferred embodiment, conductor patterns are disposed on the upper surface 512 of the piezoelectric substrate 510 in the same manner as in the surface acoustic wave device of the fourth preferred embodiment. The interconnection lines are arranged in the same manner as in the fourth preferred embodiment.

That is, similar to the fourth preferred embodiment shown in FIG. 8, conductor patterns are disposed on the upper surface 512 of the piezoelectric substrate 510 so that a reception filter 70 and a transmission filter 60 are connected to a common antenna pad 41, and a portion of an interconnection line of the reception filter 70 is disposed on the support layer 530. That is, the reception filter 70 is a ladder filter. An interconnection line between the resonators 320 and 330 of the reception filter 70 is separated, and the resonators 320 and 330 are connected to the relay pads 74 and 75, respectively. The relay pad 74 is electrically connected to the relay pad 75 using a via interconnection line 525 that passes through the support layer 530 and a support layer interconnection line 526 formed on the upper surface 532 of the support layer 530. In the ninth preferred embodiment, the filters 60 and 70 are boundary acoustic wave filters, and the resonators 210, 220, 230, 240, 310, 320, 330, 340, and 350 are boundary acoustic wave resonators.

In the boundary acoustic wave device according to the ninth preferred embodiment, similar to the fourth preferred embodiment, a portion of an interconnection line between the resonators 320 and 330 is disposed on the support layer 530. Accordingly, the capacitive coupling between the interconnection lines is reduced, and therefore, the isolation is improved, as compared to the case in which substantially the entire interconnection line between the resonators 320 and 330 is disposed on the piezoelectric substrate 510.

In addition, the isolation characteristic is improved even when a portion of the interconnection line between the resonators 310 and 320 is disposed on the support layer 530 in place of a portion of the interconnection line between the resonators 320 and 330. However, similar to the fourth preferred embodiment, it is preferable that the interconnection line between the resonator 320 and 330 that is close to the reception output pad 72 is separated on the piezoelectric substrate 510, since the advantage is maximized. The interconnection line between the resonator 320 and 330 tends to be easily affected by noise on the transmission side caused by attenuation of a reception signal.

Tenth Preferred Embodiment

According to a tenth preferred embodiment, a boundary acoustic wave device has a structure substantially the same as that of the sixth preferred embodiment. However, unlike the sixth preferred embodiment, conductor patterns are disposed on the upper surface 512 of the piezoelectric substrate 510 in a similar manner as in the surface acoustic wave device of the fifth preferred embodiment. The interconnection lines are arranged in substantially the same manner as in the fifth preferred embodiment.

That is, according to the tenth preferred embodiment, similar to the fifth preferred embodiment shown in FIG. 9, the boundary acoustic wave device is a filter including only a pair of filters 80 and a three-stage ladder filter including seven resonators 210, 220, 230, 240, 250, 260, and 270. In the tenth preferred embodiment, the filter 80 shown in FIG. 9 is a boundary acoustic wave, and the resonators 210, 220, 230, and 240 are boundary acoustic wave resonators.

The arrangement of the interconnection lines is similar to that of the fifth preferred embodiment. That is, a portion of an interconnection line that electrically connects the pad 65 to the pad 66 is disposed on the upper surface 532 of the support layer 530. The pad 65 is connected to the pad 66 using an interconnection line that passes through the support layer 530 (a via interconnection line 525 passing through the support layer and a support layer interconnection line 526 disposed on the support layer 530). Accordingly, the capacitive coupling between the interconnection lines is reduced, and therefore, the VSWR of the filter is increased, as compared to the case in which an interconnection point between the resonators 220 and 250 is connected to the resonator 210 using only an interconnection line disposed on the piezoelectric substrate 510.

In addition, a portion of the interconnection line cascade connecting two longitudinally coupled resonator type filters to each other may be disposed on the upper surface 532 of the support layer 530. Even in such a case, capacitive coupling between the interconnection lines is reduced, and therefore, the VSWR of the filter is improved, as compared to cascade connecting two longitudinally coupled resonator type filters by only an interconnection line disposed on the piezoelectric substrate 510.

The boundary acoustic wave element is a boundary acoustic wave resonator or a longitudinally coupled resonator type filter.

As described above, by disposing the conductor patterns 25v, 25x, 25y, and 25z (cover interconnection lines) on the cover 32, capacitive coupling between the interconnection lines is reduced. Accordingly, in the duplexers according to the first to fourth preferred embodiments, the isolation is improved. In the filter according to the fifth preferred embodiment, the VSWR of the filter is improved. In addition, by disposing a conductor pattern (a support layer interconnection line) on the upper surface 532 of the support layer 530, capacitive coupling between the interconnection lines is reduced. Accordingly, in the duplexers according to the sixth to ninth preferred embodiments, the isolation is improved. In the filter according to the tenth preferred embodiment, the VSWR of the filter is improved.

While the present invention has been described in connection with the above-described exemplary preferred embodiments, it is to be understood that a variety of modifications may be made to the described preferred embodiments.

For example, the structures of the reception surface acoustic wave filter and the transmission surface acoustic wave filter are not limited to those of the above-described preferred embodiments. The reflectors of the surface acoustic wave resonators may be omitted. The structures of the reception boundary acoustic wave filter and the transmission boundary acoustic wave filter are not limited to those of the above-described preferred embodiments. The reflectors of the boundary acoustic wave resonators may be omitted.

In addition, the surface acoustic wave device may have a structure which does not include the reinforcing resin 36. In such a case, it is preferable that the interconnection line (the conductor pattern 25) disposed on the cover 32 is provided on a major surface facing the piezoelectric substrate 12 (the lower surface 34).

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a piezoelectric substrate;
   a cover joined to the piezoelectric substrate with a support layer disposed therebetween and with a space maintained therebetween;
   a transmission surface acoustic wave filter and a reception surface acoustic wave filter disposed on a major surface of the piezoelectric substrate adjacent to the cover and inside the support layer; and
   external electrodes provided on a side of the cover opposite to a side facing the piezoelectric substrate, the external electrodes including an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter; wherein
   the reception surface acoustic wave filter is electrically connected to the antenna terminal via an interconnection line, and the interconnection line includes a piezoelectric substrate line disposed on the piezoelectric substrate, a cover line disposed on one of an upper surface and a lower surface of the cover, and a via line that passes through the support layer and the cover so as to connect one end of the piezoelectric substrate line to one end of the cover line;
   the reception surface acoustic wave filter is a balanced surface acoustic wave filter including one unbalanced signal terminal to which an unbalanced signal is input and two balanced signal terminals that output balanced signals; and
   the antenna terminal is electrically connected to the unbalanced signal terminal, and the reception output terminal is electrically connected to the balanced signal terminals.

2. A surface acoustic wave device comprising:
   a piezoelectric substrate;
   a cover joined to the piezoelectric substrate with a support layer disposed therebetween and with a space maintained therebetween;
   a transmission surface acoustic wave filter and a reception surface acoustic wave filter disposed on a major surface of the piezoelectric substrate adjacent to the cover and inside the support layer;
   external electrodes provided on a side of the cover opposite to a side facing the piezoelectric substrate, the external electrodes including an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter; and a reinforcing resin; wherein the reception surface acoustic wave filter is electrically connected to the antenna terminal via an interconnection line, and the interconnection line includes a piezoelectric substrate line disposed on the piezoelectric substrate, a cover line disposed on one of an upper surface and a lower surface of the cover, and a via line that passes through the support layer and the cover so as to connect one end of the piezoelectric substrate line to one end of the cover line; and the cover is disposed inside a peripheral portion of the piezoelectric substrate when viewed in a direction substantially perpendicular to the major surface of the piezoelectric substrate, and the reinforcing resin covers substantially the entire portion from the major surface of the cover remote from the piezoelectric substrate to the peripheral portion of the major surface of the piezoelectric substrate.

3. A surface acoustic wave device comprising:

a piezoelectric substrate;

a cover joined to the piezoelectric substrate with a support layer disposed therebetween and with a space maintained therebetween;

a transmission surface acoustic wave filter and a reception surface acoustic wave filter disposed on a major surface of the piezoelectric substrate adjacent to the cover and inside the support layer;

external electrodes provided on a side of the cover opposite to a side facing the piezoelectric substrate, the external electrodes including an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter; and a reinforcing resin; wherein the transmission surface acoustic wave filter includes plurality of series-connected surface acoustic wave resonators;

an interconnection line that electrically connects at least one pair of neighboring series-connected surface acoustic wave resonators includes at least one cover line disposed on one of an upper surface and a lower surface of the cover and at least one pair of via lines that pass through at least the support layer so as to connect the at least one cover line to one of the at least one pair of the neighboring series-connected surface acoustic wave resonators and the other surface acoustic wave resonator; and the cover is disposed inside a peripheral portion of the piezoelectric substrate when viewed in a direction substantially perpendicular to the major surface of the piezoelectric substrate, and the reinforcing resin covers substantially the entire portion from the major surface of the cover remote from the piezoelectric substrate to the peripheral portion of the major surface of the piezoelectric substrate.

4. A surface acoustic wave device comprising:

a piezoelectric substrate;

a cover joined to the piezoelectric substrate with a support layer disposed therebetween and with a space maintained therebetween;

a transmission surface acoustic wave filter and a reception surface acoustic wave filter disposed on a major surface of the piezoelectric substrate adjacent to the cover and inside the support layer;

external electrodes provided on a side of the cover opposite to a side facing the piezoelectric substrate, the external electrodes including an antenna terminal electrically connected to the transmission surface acoustic wave filter and the reception surface acoustic wave filter, a transmission input terminal electrically connected to the transmission surface acoustic wave filter, and a reception output terminal electrically connected to the reception surface acoustic wave filter; and a reinforcing resin; wherein the reception surface acoustic wave filter includes a plurality of series-connected surface acoustic wave resonators;

an interconnection line that electrically connects at least one pair of neighboring series-connected surface acoustic wave resonators includes at least one cover line disposed on one of an upper surface and a lower surface of the cover and at least one pair of via lines that passes through at least the support layer so as to connect the at least one cover line to one of the at least one pair of the neighboring series-connected surface acoustic wave resonators and the other surface acoustic wave resonator; and the cover is disposed inside a peripheral portion of the piezoelectric substrate when viewed in a direction substantially perpendicular to the major surface of the piezoelectric substrate, and the reinforcing resin covers substantially the entire portion from the major surface of the cover remote from the piezoelectric substrate to the peripheral portion of the major surface of the piezoelectric substrate.

5. A surface acoustic wave device comprising:

a piezoelectric substrate;

a cover joined to the piezoelectric substrate with a support layer disposed therebetween and with a space maintained therebetween;

a surface acoustic wave filter disposed on a major surface of the piezoelectric substrate adjacent to the cover and inside the support layer;

external terminals provided on a side of the cover opposite to a side facing the piezoelectric substrate, the external terminals including an input terminal and an output terminal electrically connected to the surface acoustic wave filter; and reinforcing resin; wherein the surface acoustic wave filter includes a plurality of series-connected surface acoustic wave elements;

an interconnection line that electrically connects at least one pair of neighboring series-connected surface acoustic wave elements includes at least one cover line disposed on one of an upper surface and a lower surface of the cover and at least one pair of via lines that passes through at least the support layer so as to connect the at least one cover line to one of the at least one pair of the neighboring series-connected surface acoustic wave elements and the other surface acoustic wave element; and the cover is disposed inside a peripheral portion of the piezoelectric substrate when viewed in a direction substantially perpendicular to the major surface of the piezoelectric substrate, and the reinforcing resin covers substantially the entire portion from the major surface of the cover remote from the piezoelectric substrate to the peripheral portion of the major surface of the piezoelectric substrate.

6. A boundary acoustic wave device comprising:

a piezoelectric substrate;

a cover joined to the piezoelectric substrate with a support layer disposed therebetween, the support layer being disposed on an upper surface of the piezoelectric substrate;

a transmission boundary acoustic wave filter and a reception boundary acoustic wave filter disposed at an interface between the piezoelectric substrate and the support layer; and external electrodes provided on a side of the cover opposite to a side facing the piezoelectric substrate, the external electrodes including an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter; wherein the reception boundary acoustic wave filter is electrically connected to the antenna terminal via an interconnection line, and the interconnection line includes a piezoelectric substrate line formed on the piezoelectric substrate, a support layer line disposed on an upper surface of the cover, and a via line that passes through the support layer so as to connect one end of the piezoelectric substrate line to one end of the support layer line.

7. The boundary acoustic wave device according to claim 6, wherein the reception boundary acoustic wave filter is a balanced boundary acoustic wave filter including one unbalanced signal terminal to which an unbalanced signal is input and two balanced signal terminals that output balanced signals; and the antenna terminal is electrically connected to the unbalanced signal terminal, and the reception output terminal is electrically connected to the balanced signal terminals.

8. The boundary acoustic wave device according to claim 6, wherein the support layer line is made of a plated material.

9. A boundary acoustic wave device comprising:

a piezoelectric substrate;

a cover joined to the piezoelectric substrate with a support layer disposed therebetween, the support layer being disposed on an upper surface of the piezoelectric substrate;

a transmission boundary acoustic wave filter and a reception boundary acoustic wave filter disposed at an interface between the piezoelectric substrate and the support layer; and external electrodes provided on a side of the cover opposite to a side facing the piezoelectric substrate, the external electrodes including an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter; wherein the transmission boundary acoustic wave filter includes a plurality of series-connected boundary acoustic wave resonators; and an interconnection line that electrically connects at least one pair of neighboring series-connected boundary acoustic wave resonators includes at least one support layer line disposed on an upper surface of the support layer and at least one pair of via lines that passes through at least the support layer so as to connect the at least one support layer line to one of the at least one pair of the neighboring series-connected boundary acoustic wave resonators and the other boundary acoustic wave resonator.

10. The boundary acoustic wave device according to claim 9, wherein the support layer line is made of a plated material.

11. A boundary acoustic wave device comprising:

a piezoelectric substrate;

a cover joined to the piezoelectric substrate with a support layer disposed therebetween, the support layer being disposed on an upper surface of the piezoelectric substrate;

a transmission boundary acoustic wave filter and a reception boundary acoustic wave filter disposed at an interface between the piezoelectric substrate and the support layer; and external electrodes provided on a side of the cover opposite to a side facing the piezoelectric substrate, the external electrodes including an antenna terminal electrically connected to the transmission boundary acoustic wave filter and the reception boundary acoustic wave filter, a transmission input terminal electrically connected to the transmission boundary acoustic wave filter, and a reception output terminal electrically connected to the reception boundary acoustic wave filter; wherein the reception boundary acoustic wave filter includes a plurality of series-connected boundary acoustic wave resonators; and an interconnection line that electrically connects at least one pair of neighboring series-connected boundary acoustic wave resonators includes at least one support layer line disposed on an upper surface of the cover and at least one pair of via lines that passes through at least the support layer so as to connect the at least one support layer line to one of the at least one pair of the neighboring series-connected boundary acoustic wave resonators and the other boundary acoustic wave resonator.

12. The boundary acoustic wave device according to claim 11, wherein the support layer line is made of a plated material.

13. A boundary acoustic wave device comprising:

a piezoelectric substrate;

a cover joined to the piezoelectric substrate with a support layer disposed therebetween the support layer being disposed on an upper surface of the piezoelectric substrate;

a boundary acoustic wave filter disposed at an interface between the piezoelectric substrate and the support layer; and external terminals provided on a side of the cover opposite to a side facing the piezoelectric substrate, the external terminals including an input terminal and an output terminal electrically connected to the boundary acoustic wave filter; wherein the boundary acoustic wave filter includes a plurality of series-connected boundary acoustic wave elements; and an interconnection line that electrically connects at least one pair of neighboring series-connected boundary acoustic wave elements includes at least one support layer line disposed on an upper surface of the cover and at least one pair of via lines that passes through at least the support layer so as to connect the at least one support layer line to one of the at least one pair of the neighboring series-connected boundary acoustic wave elements and the other boundary acoustic wave element.

14. The boundary acoustic wave device according to claim 12, wherein the support layer line is made of a plated material.

* * * * *